(12) United States Patent
Tran et al.

(10) Patent No.: US 7,750,327 B2
(45) Date of Patent: Jul. 6, 2010

(54) DEVICE FOR THE GENERATION OF A GAS CURTAIN FOR PLASMA-BASED EUV RADIATION SOURCES

(75) Inventors: Chinh Duc Tran, Goettingen (DE);
Jesko Brudermann, Goettingen (DE);
Bjoern Mader, Hannover (DE); Gilbert Dornieden, Duderstadt (DE); Thomas Brauner, Berlin (DE)

(73) Assignee: XTREME technologies GmbH, Jena (DE)

( * ) Notice: Subject to any disclaimer, the term of this patent is extended or adjusted under 35 U.S.C. 154(b) by 157 days.

(21) Appl. No.: 12/120,536

(22) Filed: May 14, 2008

(65) Prior Publication Data

US 2008/0283779 A1 Nov. 20, 2008

(30) Foreign Application Priority Data

May 16, 2007 (DE) .................. 10 2007 023 444

(51) Int. Cl.
*H04H 1/04* (2006.01)
(52) U.S. Cl. .................. 250/504 R; 250/505.1
(58) Field of Classification Search ............. 250/504 R, 250/505.1; 378/119, 156, 158
See application file for complete search history.

(56) References Cited

U.S. PATENT DOCUMENTS 6,714,624 B2 *  3/2004  Fornaciari et al. .......... 378/119

| | | | |
|---|---|---|---|
| 6,881,971 | B2 | 4/2005 | Ahmad |
| 2007/0080307 | A1 | 4/2007 | Bruijn et al. |

FOREIGN PATENT DOCUMENTS

| | | |
|---|---|---|
| DE | 10 2004 029 354 | 12/2005 |
| DE | 10 2005 020 521 | 11/2006 |
| EP | 1 274 287 | 1/2003 |
| EP | 1 391 785 | 2/2004 |
| WO | 03/026363 | 3/2003 |

* cited by examiner

*Primary Examiner*—Kiet T Nguyen
(74) *Attorney, Agent, or Firm*—Frommer Lawrence & Haug LLP

(57) ABSTRACT

The invention is directed to a device for generating flows of gas for filtering the radiation emitted in plasma-based radiation sources. It is the object of the invention to find a novel possibility for generating a gas curtain in the immediate vicinity of a radiating plasma so as to permit a simple arrangement and design and a long life of the device for generating the gas curtain under extreme thermal stress. According to the invention, this object is met in that a slit nozzle is formed of a plurality of partial bodies comprising different materials to form a supersonic nozzle profile for the generation of a broad gas curtain in order to accommodate the slit nozzle to different thermal and precision-mechanical requirements in the gas inlet region and in the gas outlet region.

30 Claims, 5 Drawing Sheets

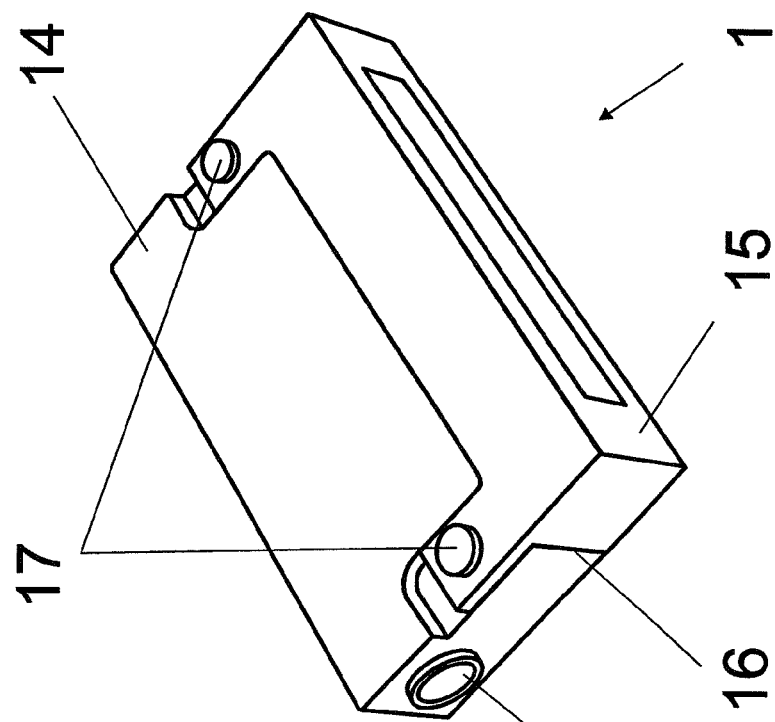
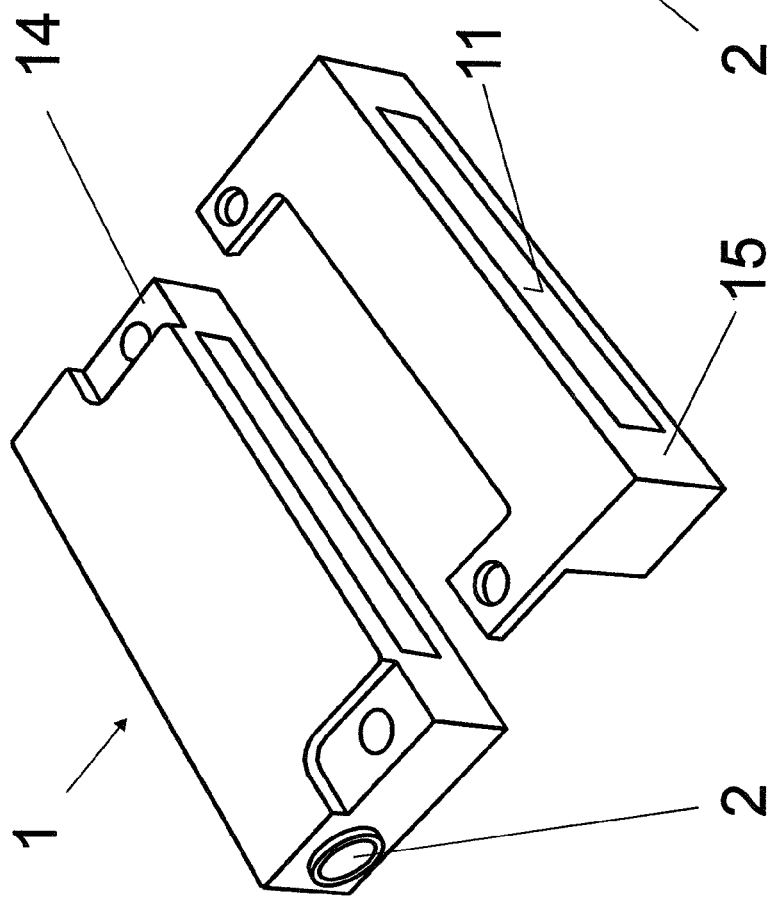
Fig. 2

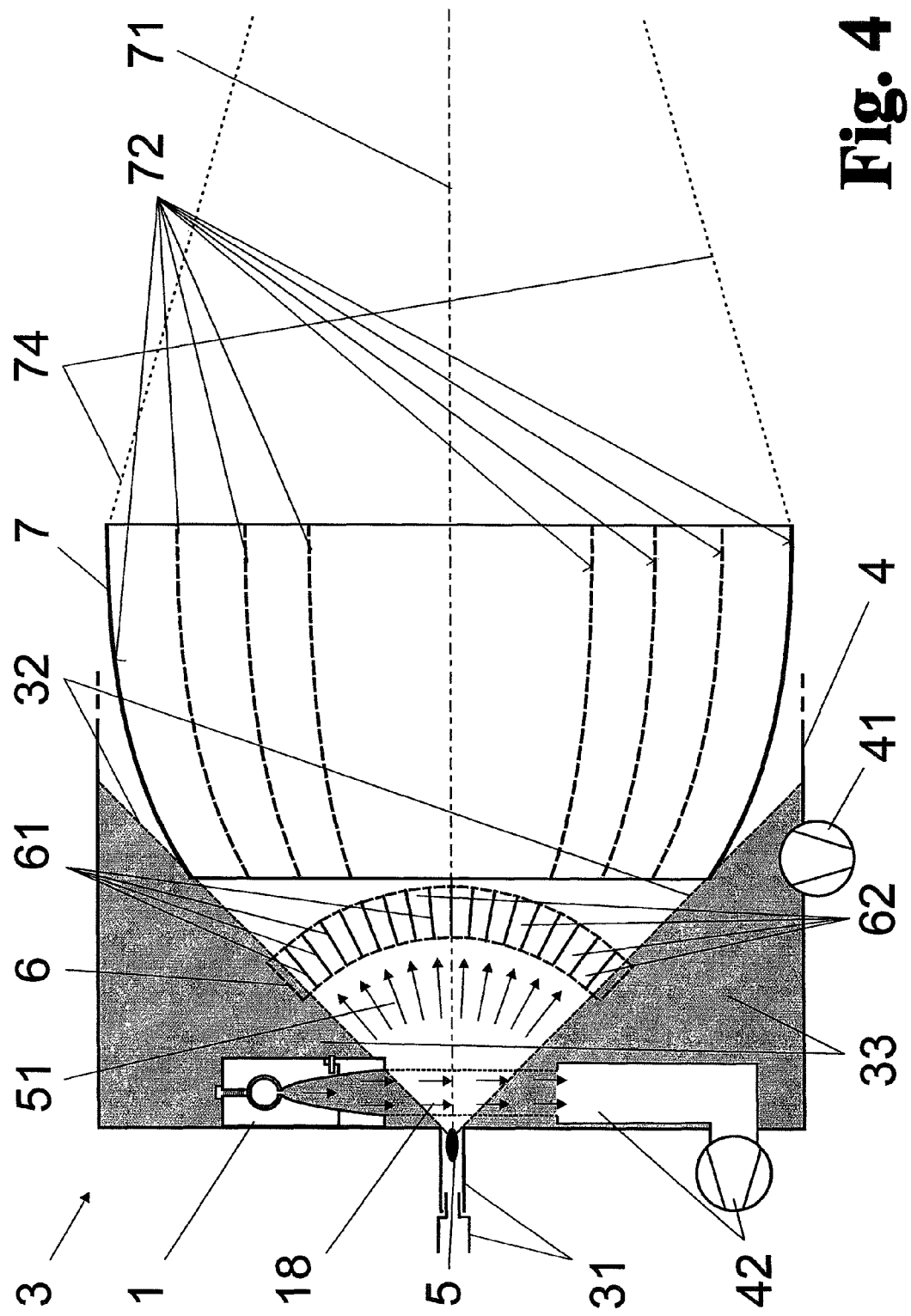

DEVICE FOR THE GENERATION OF A GAS CURTAIN FOR PLASMA-BASED EUV RADIATION SOURCES

CROSS-REFERENCE TO RELATED APPLICATIONS

This application claims priority of German Application No. 10 2007 023 444.0, filed May 16, 2007, the complete disclosure of which is hereby incorporated by reference.

BACKGROUND OF THE INVENTION a) Field of the Invention

The invention is directed to a device for generating flows of gas for filtering the radiation emitted in plasma-based radiation sources in which at least one supersonic slit nozzle is provided for generating a gas curtain in the beam bundle that can be coupled out.

b) Description of the Related Art

The invention is preferably applied in semiconductor chip fabrication in radiation sources for EUV lithography for protecting the collector optics and other optics downstream of the latter from debris.

As per the current state of the art, the structuring of semiconductor chips is carried out by means of optical lithography. To this end, the desired structure contained on a mask is imaged onto a semiconductor wafer. A light-sensitive coating on this semiconductor wafer undergoes chemical changes through exposure and accordingly allows further selective working of exposed and unexposed surfaces. The spatial resolution that can be achieved by this method is limited by the wavelength of the light that is used. Progressive miniaturization requires a continual increase in resolution which can only be achieved through a reduction in the light wavelength. Extreme ultraviolet (EUV) radiation with a wavelength of 13.5 nm is provided as a substitute for the formerly used DUV excimer lasers with a wavelength of 193 nm. Plasma-based radiation sources must be resorted to for generating these wavelengths. Because every known material is highly absorbent for EUV radiation, the entire process from generation of radiation to exposure must be carried out under high vacuum using reflecting optics.

High-power radiation sources for EUV radiation are based on a luminous plasma that is generated by a laser pulse (LPP—Laser-Produced Plasma) or a gas discharge (GDP—Gas Discharge Plasma). In so doing, a material, e.g., xenon, tin or lithium, is heated to temperatures of several hundred thousand degrees so that the occurring plasma is emitted in the EUV region. This radiation is collected by means of collector optics and imaged in an intermediate focus which constitutes the interface to the adjoining exposure module. Aside from achieving the highest possible radiation output in the wavelength region around 13.5 nm, the life of the plasma-generating components of the radiation source and of the collector optics is of primary importance. The plasma emits not only the desired radiation but also high-energy particles and larger clusters, collectively referred to as debris. Depending on the operating parameters, the emitted debris leads to abrasion of reflecting layers, deposits of impurities, or a coarsening of the optical surface. All of these processes reduce the reflectivity of the optics. Therefore, devices for protecting the collector optics from debris play a key role in the successful use of high-power EUV sources.

The following basic principles are known for protecting the collector optics:

a) mechanically moving apertures and shutters that pass the radiation pulse and seal against slower debris particles b) stationary or rotating arrangements of fins or plates disclosed, e.g., in EP 1 274 287 A1 and EP 1 391 785 A1 having fins or plates which are oriented substantially exclusively in radial direction toward the locus of emission and which capture the debris particles by adhesion c) electric and/or magnetic fields (usually in combination with filters for uncharged particles) such as are described, e.g., in U.S. Pat. No. 6,881,971 B2 d) spaces which are filled with buffer gas and in which debris particles are decelerated by collision with gas particles (and are eliminated through suction or other filter means as described, e.g., in DE 10 2005 020 521 A1), and e) buffer gas curtains forming a fast, flat lateral gas flow which decelerate and deflect debris particles (see WO 2003/26363 A1).

Basically, these same debris filter concepts are used for GDP sources and LPP sources, but with the difference that in GDP sources the plasma occurs in the immediate spatial vicinity of an electrode system so that only a limited solid angle of emitted radiation is available, whereas in LPP sources substantially larger radiation angles must be covered.

It has long been known to employ streaming buffer gases in the evacuated chambers for generating plasma in combination with mechanical and field-coupled debris filters because the gas particles decelerate and/or deflect the debris particles by colliding with them and appreciably improve the action of additional debris filters. However, an efficient evacuation system must be used to maintain a reduced extinction effect of the buffer gas for the emitted EUV radiation.

The use of a gas curtain, as is mentioned above (e) and described in WO 2003/26363 A1, is a particularly efficient way to filter debris. When implemented with supersonic nozzles, a gas curtain of this kind can even deflect larger debris clusters adequately and hardly interferes with the vacuum needed to generate plasma. Further, it requires little space and can be used in the immediate vicinity of the plasma.

However, the problem with using a gas curtain is that its extension (within a plane) is spatially limited so that the generating slit nozzle must be moved as close as possible to the plasma in order to cover a large solid angle of the EUV radiation. This results in a high thermal stress on the nozzle. However, supersonic slit nozzles comprise extremely precise, highly engineered shapes which are difficult to cool and extremely difficult to produce from high-melting materials (e.g., tungsten or molybdenum).

OBJECT AND SUMMARY OF THE INVENTION

It is the primary object of the invention to find a novel possibility for generating a gas curtain in the immediate vicinity of a radiating plasma so as to permit a simple arrangement and design and a long life of the device for generating the gas curtain under extreme thermal stress.

In a device for generating gas flows for filtering the emitted radiation in plasma-based radiation sources in which at least one supersonic slit nozzle is provided for generating a gas curtain in the radiation bundle that can be coupled out, the above-stated object is met according to the invention in that the slit nozzle is formed of a plurality of partial bodies comprising different materials to form a supersonic nozzle profile for the generation of a broad gas curtain in order to accommodate the slit nozzle to different thermal and precision-mechanical requirements.

The slit nozzle advantageously comprises a gas inlet part and a gas outlet part to form the nozzle profile. The gas inlet part is made of a metal that is easily workable with respect to high-precision mechanics and the gas outlet part is made of a high-melting metal. The gas inlet part is preferably manufactured from steel or stainless steel, while the gas outlet part is advisably fashioned from molybdenum or tungsten. The reason is that the gas outlet is located closer to the center of the plasma, so it is exposed more heat load.

The slit nozzle advantageously contains a gas distribution pipe for streaming the gas into the nozzle profile in a defined direction. The gas distribution pipe has, along a surface line, a gas inlet row which is formed so as to be longitudinally uniform for radial passage of gas.

The gas inlet row is advisably formed as a series of equidistantly disposed circular holes, elongated holes, or as a continuous slot. Circular holes of the gas inlet row preferably have a diameter of between 10 μm and 500 μm. For elongated holes or a continuous slot, the width is advantageously between 30 μm and 300 μm, the length of the elongated holes can preferably be from 1 mm to 20 mm. The distances between the individual circular holes or elongated holes are advisably selected in the range of 1 mm to 5 mm.

The dimensioning of the openings of the gas inlet row is basically dictated by:
a) the type of gas (smaller holes for lighter gases, larger holes for heavier gases),
b) the desired properties of the gas curtain (pressure and density in the gas flow, directional focusing, and Mach number of the gas flow),
c) the permissible through-flow quantities (capacity of the vacuum pumps in the flow range of the gas curtain and realizable pressures in the gas feed line), and
d) geometric factors (width of the gas curtain, size of the vacuum chamber, etc.).

The gas distribution pipe can be made of a metal material or a ceramic material. The gas feed for supplying the gas is advantageously arranged at a front side of the gas distribution pipe.

The partial bodies of the slit nozzle such as the gas inlet part, gas outlet part or gas distribution pipe are advisably joined together by a detachable connection. Pins, screws, rivets, clamps or a sleeve can be used for this purpose.

The partial bodies of the slit nozzle can also be put together by means of a permanent connection, e.g., material bonds (welding, soldering or gluing) or at least one detachable connection (e.g., for the gas distribution pipe) and one permanent connection (for connecting the partial bodies).

Further, in an arrangement for generating EUV radiation based on a gas discharge in which an electrode arrangement for generating a gas discharge plasma and collector optics for collecting along an optical axis the EUV radiation emitted from the plasma are arranged in a vacuum chamber and a slit nozzle for generating a gas curtain is arranged orthogonal to the optical axis between the plasma and collector optics, the above-mentioned object is met in that the slit nozzle has at least one gas outlet part made of high-melting material and additional parts for the gas inlet are produced from material which is easily workable with respect to high-precision mechanics, and the slit nozzle is fastened at least partially in a radiation shadow of the electrode arrangement provided for generating plasma, and a suction device for the gas curtain is arranged opposite to the optical axis of the collector optics, likewise in the radiation shadow.

The collector optics are advantageously grazingly reflecting reflection optics comprising nested collector mirrors, and a mechanical fin arrangement is arranged between the gas curtain, which is generated by the slit nozzle and suction device, and the collector optics.

The gas curtain which is generated between the slit nozzle and suction device preferably comprises a buffer gas for decelerating debris particles which achieves a high level of debris suppression in cooperation with the mechanical fin arrangement. The gas curtain can also comprise a gas mixture that is provided for spectral filtering of the EUV radiation generated by the plasma in order to achieve a required spectral purity (elimination of out-of-band radiation) of the emitted EUV radiation, Further, in an arrangement for generating EUV radiation based on a laser-generated plasma in which a laser beam for generating the EUV radiation-emitting plasma is directed in a vacuum chamber to targets supplied along a target path, and collector optics for collecting along an optical axis the EUV radiation emitted from the plasma and a slit nozzle for generating a gas curtain are arranged orthogonal to the optical axis between the plasma and collector optics, the above-mentioned object is met in that the slit nozzle has at least one gas outlet part of high-melting material and additional parts for the gas inlet are produced from materials which are easily workable with respect to high-precision mechanics, and the slit nozzle is arranged outside a focusable radiation cone, and a suction device for the gas curtain is likewise arranged outside a focusable radiation cone opposite to the optical axis of the collector optics.

In this case, a collector mirror that is formed in reflection optics for normal incidence of radiation is advisably used as collector optics and is arranged behind the plasma, an additional mechanical fin arrangement for suppressing debris being arranged between the gas curtain generated by the slit nozzle and suction device and the collector optics. The gas curtain generated between the slit nozzle and the suction device preferably comprises a buffer gas for decelerating debris particles. However, it can also comprise a gas mixture which brings about a spectral filtering of the emitted EUV radiation at the same time.

An additional slit nozzle for generating another gas curtain downstream of the plasma is advantageously provided in direction of the beam bundle that is focused by the collector mirror, a suction device being arranged opposite to the optical axis. This additional gas curtain generated by the slit nozzle and suction device can advantageously be a buffer gas for decelerating debris particles from the plasma but can also be a gas mixture for spectral filtering of the EUV radiation generated by the plasma.

The solution according to the invention makes it possible to realize a gas curtain in the immediate vicinity of a radiating plasma, which permits a simple arrangement and design and a long life of the slit nozzle under extreme thermal stresses. Further, the solution is suitable for different modes of generating EUV radiation-emitting plasma and, in addition to suppression of debris, enables a spectral filtering of the generated radiation in the same way.

The invention will be described more fully in the following with reference to embodiment examples.

BRIEF DESCRIPTION OF THE DRAWINGS

In the drawings:

FIG. 2 shows views of the slit nozzle comprising a gas inlet part and a gas outlet part in disassembled state (at left) and in assembled state (at right);

FIG. 4 shows an arrangement of a slit nozzle according to the invention in a gas discharge EUV source.

DESCRIPTION OF THE PREFERRED EMBODIMENTS

Figure 1:
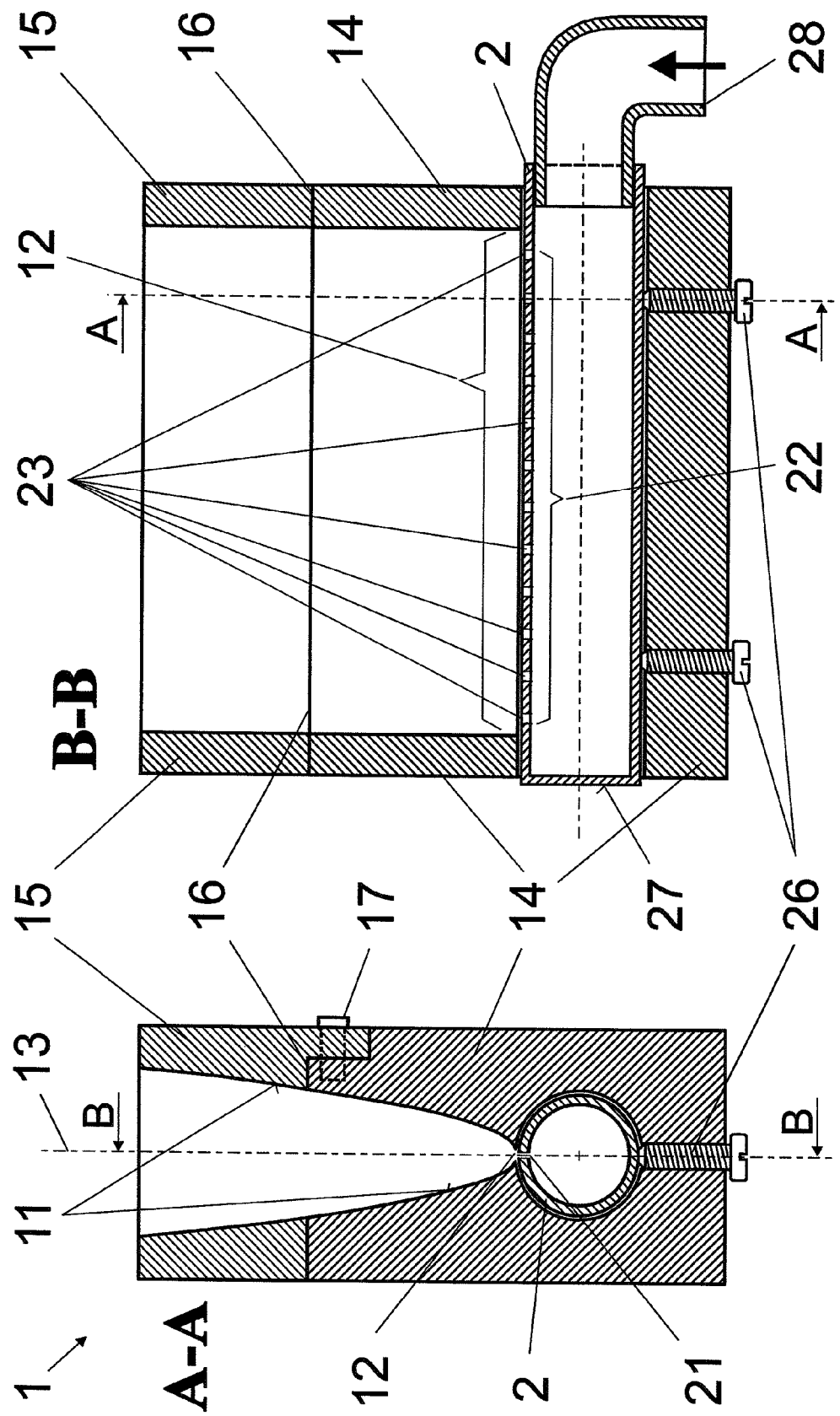
FIG. 1 shows the basic construction of a slit nozzle according to the invention in cross section (at left) and in longitudinal section (at right)

FIG. 1 shows the construction of a slit nozzle 1 according to the invention in cross section and in longitudinal section. The slit nozzle 1 for forming a supersonic nozzle with a slit-shaped nozzle profile 11 is divided with respect to the gas outlet direction and comprises at least one gas inlet part 14 and a gas outlet part 15. The gas outlet part 15 is manufactured from a heat-resistant material (such as tungsten, molybdenum, or the like) in view of the high thermal loading because of its immediate proximity to the plasma. The gas inlet part 14 of the slit nozzle 1 is made of a material which is not quite as resistant to heat but which can be machined more easily (e.g., stainless steel). Both parts 14 and 15 must be adapted to one another in such a way that the gas inlet part 14 and gas outlet part 15 form a nozzle profile 11 with a joint 16 that is as closed as possible so as not to generate a tear-off edge for the gas flow. The slit nozzle 1 has an entrance slit 12 for the gas to be streamed out, adjoined by a nozzle profile 11 which has a parabolic cross section and which is symmetric to a center plane 13 of the nozzle (section plane B-B). The center plane 13 of the nozzle defined by the nozzle profile 11 and the entrance slit 12 is also the (center) plane of the gas curtain 18 to be generated. The nozzle profile 11 in each plane orthogonal to the center plane 13 of the nozzle has the same cross section shown on the left-hand side of FIG. 1 (section plane A-A). A cylindrical recess in which a gas distribution pipe 2 is inserted for introducing the buffer gas is arranged in front of the nozzle profile 11 in the gas inlet part 14 of the slit nozzle 1 along the entrance slit 12.

Figure 3A:
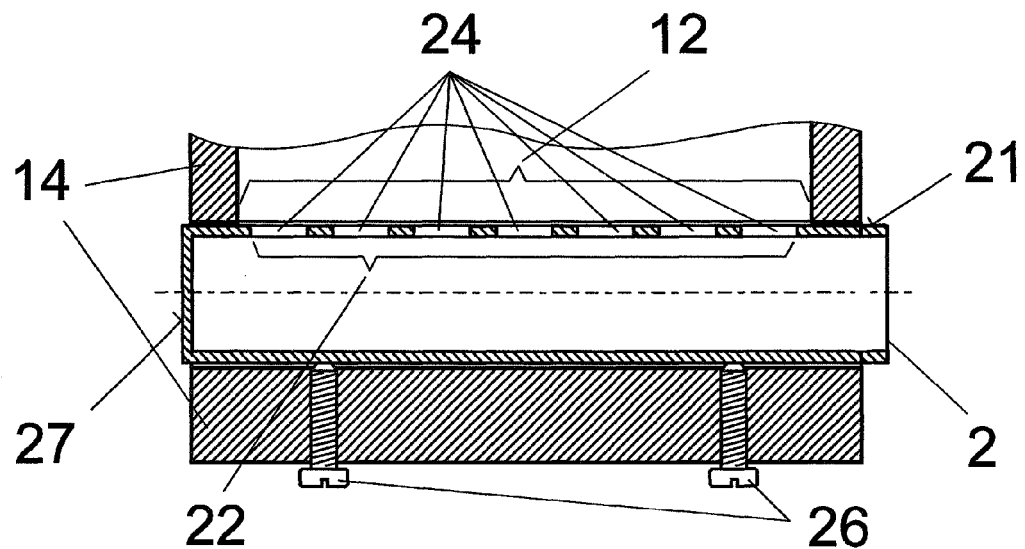
FIG. 3a and 3b show two further embodiment forms of the distribution pipe of the slit nozzle a) with elongated holes and b) with a continuous slot as gas inlet row.
Figure 3B:
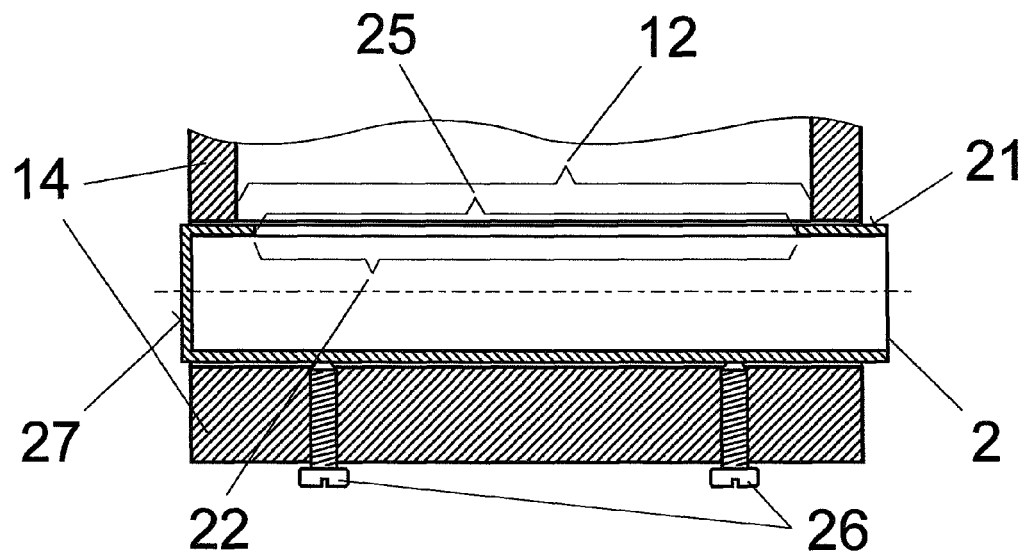

The gas distribution pipe 2 has a closed end face 27 at one side and adjoins a gas feed 28 on the opposite side. The gas distribution pipe 2 has a gas inlet row 22 along a surface line 21. This gas inlet row 22 is oriented centrally to the entrance slit 12 of the slit nozzle 1 and can comprise a plurality of small circular holes 23 (see FIG. 1) or elongated holes 24 (FIG. 3a) or a continuous slot 25 (FIG. 3b).

The dimensioning of the holes 23 according to FIG. 1 may range from several tens to several hundreds of micrometers. The width of an elongated hole 24 or of a slot is on the order of 30 μm to 300 μm. The spacing between the circular holes 23 or elongated holes 24 may reasonably range from 1 to 5 mm. A length between 1 mm and 10 mm is preferably selected for elongated holes.

The entrance slit 12 of the nozzle profile 11 in the slit nozzle 1 is two- to ten-times wider than the dimensioning of the gas inlet row 22 of the distribution pipe 2. This ensures a simple alignment of the gas distribution pipe 2 so that the gas inlet row 22 can easily be centered in the entrance slit 12 of the slit nozzle 1. If not positioned in the center, the stream could tear off at the edges of the nozzle profile 11 or generate turbulence resulting in the destruction of the gas curtain 18. The gas distribution pipe 2 is stopped by a screw 26 after the centric, symmetric alignment of the gas inlet row 22 relative to the nozzle profile 11 of the slit nozzle 1. Besides the simple alignment, this also allows the gas distribution pipe 2 to be changed quickly and simply. Other fastening techniques include clamping, soldering or welding are also possible, of course. The gas feed 28 for introducing gas into the gas distribution pipe 2 is preferably arranged at an end face 27 of the distribution pipe 2. However, it could also be arranged, e.g., centrally, at the outer surface of the distribution pipe 2.

FIG. 2 shows a perspective view of the slit nozzle 1. In the view on the left-hand side, the slit nozzle 1 is shown disassembled into the gas inlet part 14 and the gas outlet part 15 and is shown assembled in the view on the right.

In the present example, the gas inlet part 14 is made of stainless steel and the gas outlet part 15 is made of molybdenum. The gas inlet part 14 and gas outlet part 15 are held together by pins 17. However, other possible fastenings are also possible, e.g., frictionally engaging connections by means of metal sleeves or clamping brackets (e.g., of stainless steel) or material-bond connections by soldering or welding.

FIG. 4 shows the use of the slit nozzle 1 according to the invention in a gas discharge EUV source 3. A plasma 5 which emits primarily EUV radiation 51 is generated within an electrode system 31 by means of a gas discharge in a suitable work gas (e.g., xenon). All of the radiation-generating components are located in a vacuum chamber 4 that is maintained at a low pressure (several 10 Pa) by a vacuum pump system 41 to ensure suitable conditions for the generation of a plasma 5 and a low extinction of the EUV radiation 51 emitted from the plasma 5.

The geometry of the electrode system 31 limits the solid angle of the emitted EUV radiation 51 to an exit cone 32. Accordingly, the debris to be intercepted in the form of high-energy particles which are emitted from the plasma 5 on one hand and jump off of the hot surfaces of the electrode system 31 on the other hand is limited to this exit cone 32. A radiation shadow 33 is located in the vacuum chamber 4 outside the exit cone 32 of the EUV radiation 51.

The slit nozzle 1 is arranged in the vacuum chamber 4 in such a way that it remains in the radiation shadow 33, i.e., outside the exit cone 32, at least with the gas inlet part 14. The gas outlet part 15 is resistant to heat because of the choice of material and can therefore be located (partially) in the exit cone 32. Of course, geometry permitting, the slit nozzle 1 can also be mounted entirely in the radiation shadow 33.

An inert buffer gas exiting from the slit nozzle 1 generates a flat gas curtain 18 due to its supersonic speed. A suction device 42 is arranged opposite to the latter so as to interfere as little as possible with the high vacuum of the vacuum chamber 4. The gas curtain 18 is characterized by a local pressure increase and by a uniform flow direction of all of the buffer gas particles.

Due to the pressure increase within the gas curtain 18 relative to the high vacuum of the vacuum chamber 4, atoms and ions (debris) emitted by the plasma 5 undergo a large number of collisions with buffer gas atoms, which leads to their deceleration (energy release) and accordingly to a reduction in their destructive potential. Larger particles receive additional impulses in the flow direction of the gas curtain 18 due to the many collisions with the directed buffer gas particles. Depending on the size and energy of the particles, they are deflected at least far enough to adhere to a fin arrangement 6 located downstream. The fins 61 and the intermediate spaces 62 therebetween are oriented radial to the plasma 5 or to an optical axis 71 of the collector optics 7. The collector optics 7, which comprise a plurality of nested collector mirrors 72 in this construction, images the EUV radiation 51 emitted in the exit cone 32 in an intermediate focus 73 (shown only in FIG. 5) which, as an intersection of the converging lines of the focused beam bundle 74, lies in the extension of the optical axis 71 outside of FIG. 4.

The particles emitted by the plasma 5 and electrode arrangement 31 can traverse the fin arrangement 6 only in a straight line in radial directions within the exit cone 32 of the EUV radiation 51. A change in direction of the debris particles within the gas curtain 18 leads to an altered trajectory on which they cannot pass the fin structure 6 because they come into contact with one of the fins 61.

Together with the radial fin structure 6, the gas curtain 18 presents an almost impassable obstacle for individual atoms and ions as well as for larger particle clusters and is therefore an efficient method for extensive elimination of harmful debris.

Figure 5:
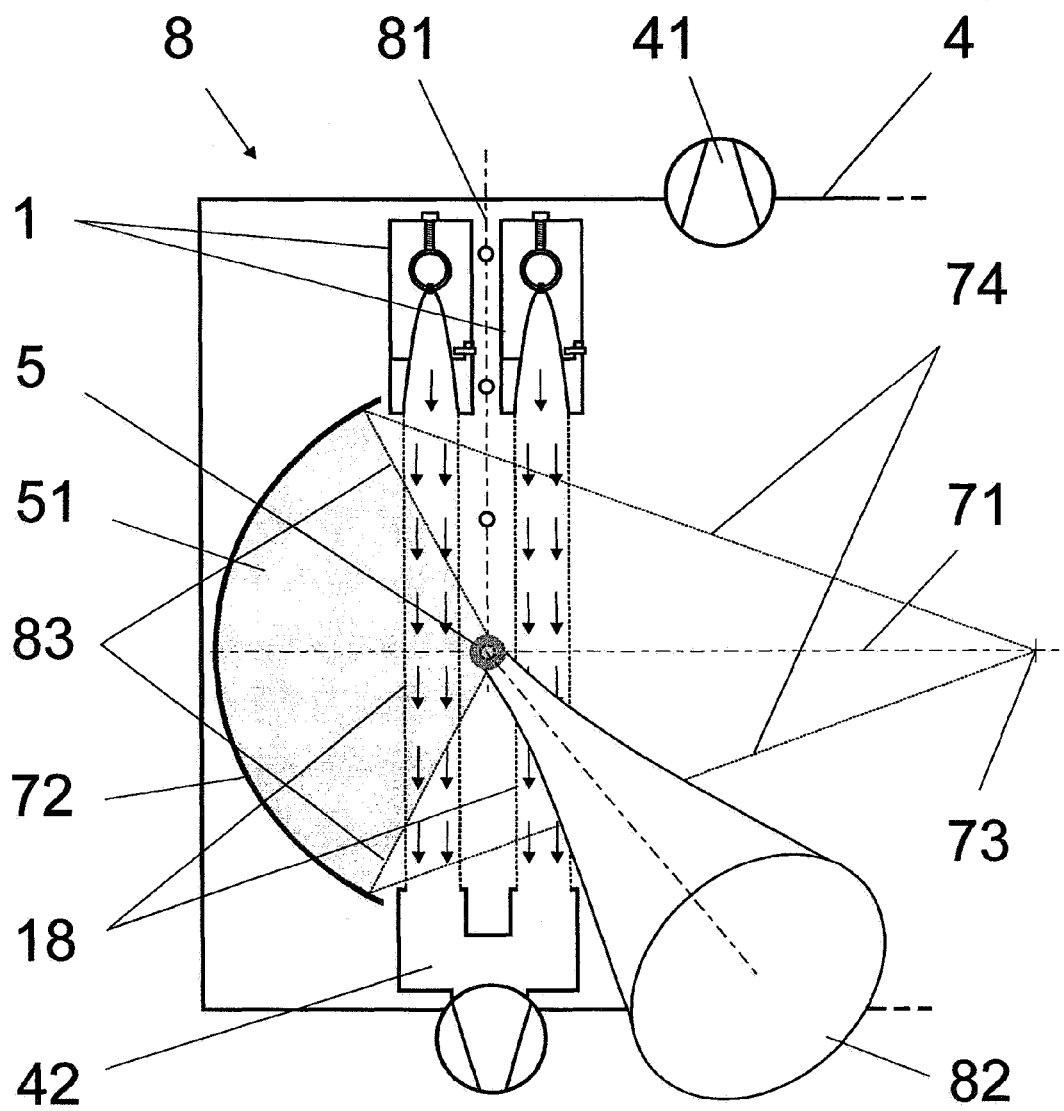
FIG. 5 shows an arrangement of slit nozzles according to the invention in a laser-based EUV source.

An advisable arrangement of the described slit nozzle 1 in an EUV source 8 based on laser-generated plasma 5 is shown schematically in FIG. 5. Without limiting generality, the target flow required for the generation of plasma was selected as individual droplets along a target path 81. The target path 81 is shown parallel to the flow direction of the gas curtain 18 for purposes of a clearer depiction, but it would also be reasonable for the direction of the target path 81 to diverge from the flow direction of the gas curtain 18 because the incident direction of the laser beam 82 extends as orthogonal as possible to the target path 81.

To protect additional imaging optics (not shown) from direct EUV radiation 51 (that is, EUV radiation 51 not focused by the collector mirror 71), another gas curtain 19 is arranged parallel to the first gas curtain 18 and is generated by a slit nozzle 1 of identical construction and is intercepted by a shared suction device 42.

The pulsed laser beam 82 provided for generating plasma 5 was shown in perspective in the foreground, although the arrangement of the rest of the components of the laser plasma EUV source 8 is strictly a side view (sectional view along the optical axis 71 of the collector mirror 72). This view was chosen in order to make it clear that the laser beam 82—like the target path 81—which is directed to the optical axis 71 (in the focus) of the collector mirror 72 substantially parallel to the two gas curtains 18 and 19 encloses, together with the target path 81, an angle diverging from 180°.

Since the solid angle in which the plasma 5 emits EUV radiation 51 is not limited by an electrode system 32 (as in FIG. 3), there is, a priori, also no suitable radiation shadow 33 available for protective positioning of the slit nozzle 1. However, a shadow area can be generated artificially by means of additional diaphragms (not shown) so that the slit nozzle 1 is arranged in a shielded manner at least outside the focusable radiation cone 83 and outside the beam bundle 84 that is focused in the intermediate focus 73.

Additional debris filters, e.g., a fin arrangement 6 (as is shown in FIG. 4), can also be used in this type of laser-generated EUV source 8 to prevent debris from reaching collector optics and other imaging optics.

While the foregoing description and drawings represent the present invention, it will be obvious to those skilled in the art that various changes may be made therein without departing from the true spirit and scope of the present invention.

REFERENCE NUMBERS 1 nozzle
11 nozzle profile
12 entrance slit
13 center plane of the nozzle
14 gas inlet part
15 gas outlet part
16 joint
17 pin
18 gas curtain
19 additional gas curtain
2 distribution pipe
21 surface line
22 gas inlet row
23 circular holes
24 elongated holes
25 (continuous) slot
26 screw
27 end face
28 gas feed
3 gas discharge EUV source
31 electrode system
32 exit cone
33 radiation shadow
4 vacuum chamber
41 vacuum pump
42 suction device
5 plasma
51 emitted EUV radiation
6 fin arrangement
61 fins
62 intermediate spaces
7 collector optics
71 optical axis
72 collector mirror
73 intermediate focus
74 focused beam bundle
8 laser radiation EUV source
81 target path
82 laser beam
83 focusable radiation cone

What is claimed is:

1. A device for filtering the radiation emitted in a plasma-based radiation source comprising:
    at least one supersonic slit nozzle for generating a gas curtain across a beam bundle, the gas curtain being coupled out from the plasma-emitted radiation; and
    wherein said slit nozzle is formed of a plurality of partial bodies comprising different materials which accommodate the slit nozzle to different thermal and precision-mechanical requirements.

2. The device according to claim 1;
    wherein the slit nozzle comprises a gas inlet part and a gas outlet part to form the nozzle profile, wherein the gas inlet part is made of a metal that is easily workable with respect to high-precision mechanics and the gas outlet part is made of a high-melting metal.

3. The device according to claim 2;
    wherein the gas inlet part is manufactured from steel or stainless steel.

4. The device according to claim 2;
    wherein the gas outlet part is fashioned from molybdenum.

5. The device according to claim 2;
    wherein the gas outlet part is fashioned from tungsten.

6. The device according to claim 1;
    wherein the slit nozzle contains a gas distribution pipe for streaming the buffer gas into the nozzle profile in a defined direction, wherein the gas distribution pipe has, along a surface line, a gas inlet row which is formed so as to be longitudinally uniform for radial passage of gas.

7. The device according to claim 6;
    wherein the gas inlet row is formed as a series of equidistantly disposed circular holes.

8. The device according to claim 7;
    wherein the circular holes of the gas inlet row have a diameter of between 10 μm and 500 μm.

9. The device according to claim 7;
wherein the circular holes or elongated holes of the gas inlet row have a distance from one another in the range from 1 mm to 5 mm.

10. The device according to claim 6;
wherein the gas inlet row is formed as a series of equidistantly disposed elongated holes.

11. The device according to claim 10;
wherein the elongated holes or the slot of the gas inlet row have or has a width between 30 μm and 300 μm.

12. The device according to claim 6;
wherein the gas inlet row is formed as a continuous slot.

13. The device according to claim 6;
wherein the gas distribution pipe is made of a metal material.

14. The device according to claim 6;
wherein the gas distribution pipe is made of a ceramic material.

15. The device according to claim 6;
wherein a gas feed for supplying the gas is provided at a front side of the gas distribution pipe.

16. The device according to claim 1;
wherein the partial bodies of the slit nozzle are joined together by detachable connections.

17. The device according to claim 16;
wherein the partial bodies of the slit nozzle are joined together by pins, screws, rivets, clamps and sleeves.

18. The device according to claim 1;
wherein the partial bodies of the slit nozzle are joined together by permanent connection.

19. The device according to claim 18;
wherein the partial bodies of the slit nozzle are joined together by at least one material bond as welding, soldering or gluing.

20. The device according to claim 1;
wherein the partial bodies of the slit nozzle are joined together by at least one detachable connection and a permanent connection.

21. The device according to claim 1;
wherein the at least one slit nozzle is disposed in an arrangement for generating EUV radiation based on a gas discharge comprising:
a vacuum chamber;
an electrode arrangement for generating a gas discharge plasma emitting EUV radiation;
collector optics for collecting along an optical axis the EUV radiation emitted from the plasma;
wherein said electrode arrangement and said collector optics are arranged in said vacuum chamber, the slit nozzle for generating the gas curtain being arranged therebetween orthogonal to the optical axis;
wherein said slit nozzle is fastened at least partially in a radiation shadow of the electrode arrangement being provided for generating the plasma; and
wherein a suction device for the gas curtain is arranged opposite to said slit nozzle with respect to the optical axis of the collector optics, likewise in the radiation shadow.

22. The device according to claim 21;
wherein the collector optics are grazingly reflecting reflection optics comprising nested collector mirrors, wherein a mechanical fin arrangement is arranged between the gas curtain generated by the slit nozzle and suction device and the collector optics.

23. The device according to claim 21;
wherein the gas curtain which is generated between the slit nozzle and suction device comprises a buffer gas for decelerating debris particles.

24. The device according to claim 21;
wherein the gas curtain generated between the slit nozzle and the suction device comprises a gas mixture for spectral filtering of the EUV radiation generated by the plasma.

25. The device according to claim 1;
wherein the at least one slit nozzle is disposed in an arrangement for generating EUV radiation based on a laser-produced plasma comprising:
a vacuum chamber;
a laser beam for generating a laser-produced plasma emitting EUV radiation being directed in said vacuum chamber to targets supplied along a target path;
collector optics for collecting along an optical axis said EUV radiation emitted from said laser-produced plasma;
wherein said laser-produced plasma and said collector optics are arranged in said vacuum chamber;
wherein the slit nozzle for generating the gas curtain is arranged orthogonal to the optical axis between said laser-produced plasma and said collector optics, and outside a focusable radiation cone; and
wherein a suction device for the gas curtain is arranged outside a focusable radiation cone opposite to the optical axis of said collector optics.

26. The device according to claim 25;
wherein a collector mirror that is formed as reflection optics for normal incidence of radiation is used as collector optics and is arranged behind the plasma, wherein an additional mechanical fin arrangement is arranged between the gas curtain, which is generated by the slit nozzle and suction device, and the collector optics.

27. The device according to claim 25;
wherein an additional slit nozzle for generating another gas curtain downstream of the plasma is provided in direction of the beam bundle that is focussed by the collector mirror, wherein a suction device is arranged opposite to the optical axis.

28. The device according to claim 27;
wherein the additional gas curtain generated between the slit nozzle and suction device comprises a buffer gas for decelerating debris particles from the plasma.

29. The device according to claim 27;
wherein the additional gas curtain generated between the slit nozzle and suction device comprises a gas mixture for spectral filtering of the EUV radiation generated by the plasma.

30. The device according to claim 25;
wherein the gas curtain generated between the slit nozzle and suction device comprises a buffer gas for decelerating debris particles.

* * * * *